United States Patent [19]
Houkes

[11] 4,227,099
[45] Oct. 7, 1980

[54] CIRCUIT ARRANGEMENT COMPRISING A HIGH-VOLTAGE POWER TRANSISTOR

[75] Inventor: Henk Houkes, Nijmegen, Netherlands

[73] Assignee: U.S. Philips Corporation, New York, N.Y.

[21] Appl. No.: 941,564

[22] Filed: Sep. 12, 1978

[30] Foreign Application Priority Data

Oct. 10, 1977 [NL] Netherlands .......................... 7711083

[51] Int. Cl.² ........................ H03K 3/26; H03K 17/60
[52] U.S. Cl. .................................... 307/315; 307/254; 307/300
[58] Field of Search .......................... 307/254, 315, 300

[56] References Cited

U.S. PATENT DOCUMENTS

3,192,399  6/1965  Ih ........................................ 307/315

FOREIGN PATENT DOCUMENTS

2408381  4/1975  Fed. Rep. of Germany .......... 307/315

*Primary Examiner*—Stanley D. Miller, Jr.
*Assistant Examiner*—B. P. Davis
*Attorney, Agent, or Firm*—Thomas A. Briody; William J. Streeter; Edward W. Goodman

[57] ABSTRACT

A Darlington pair having a high-voltage power transistor for a line deflection circuit and/or a switched-mode power supply. The drive circuit comprises two current paths, namely a switch-on path coupled to the base electrode of the high-voltage power transistor and which comprises a switched-mode current source, and a switch-off path which comprises an inductance, a substantially constant-voltage source and a switch and which is included between the base and emitter electrode of the high-voltage power transistor, the switched current flowing while the switch is cut-off and vice versa.

9 Claims, 4 Drawing Figures

CIRCUIT ARRANGEMENT COMPRISING A HIGH-VOLTAGE POWER TRANSISTOR

BACKGROUND OF THE INVENTION

The invention relates to a circuit arrangement comprising a high-voltage power transistor, drive means for supplying a pulse-shaped switching signal to the base electrode thereof and a load impedance connected to the collector electrode of the high-voltage transistor and to a supply voltage source, the collector current of the high-voltage power transistor driven to the saturation state, supplied by the supply voltage source, being interruptable under the influence of the pulse-shaped switching signal applied thereto and the drive means comprising an additional transistor the emitter electrode of which is connected to the base electrode of the high-voltage power transistor and the collector electrode to the collector electrode of the high-voltage power transistor.

Such a circuit arrangement, which is, for example, suitable for use in the line deflection circuit of television receivers, is known from an article published in the periodical "Electronics" of June 9th, 1977, pages 192 and 194. In this article it is proposed to construct the high-voltage power switch of the circuit as a so-called Darlington pair, the additional transistor amplifying the switching signal originating from a driver stage and controlling the base of the actual high-voltage power transistor. An advantage of a Darlington pair is that the additional transistor which need not switch large currents has a much higher current gain factor than the high-voltage power transistor, so that the driver stage need not supply a high power. According to said article the base current of the additional transistor is in the order of magnitude of 200 mA, so that a driver transformer is no longer required.

The use of a driver transformer may, however, be desirable, for example for isolating the ground of the circuit from the line voltage supply. This applies in particular to switched-mode power supplies which also comprise a high-voltage power switch and which may be implemented in a similar manner as a line deflection circuit and/or in combination therewith. The coupling, by means of a transformer between the driver stage and the final stage, dissipates less energy than a resistance coupling, as then a resistor must be connected to a d.c. voltage source while the driver stage can be fed, in the case of line voltage isolation, from a lower d.c. voltage source.

However, such a transformer coupling is not without problems. When the collector current of the high-voltage power transistor, which is driven to the saturation state, is to be switched off, both the base and the collector layers thereof contain a very high excess of charge carriers which must be removed. This implies that the base current which flows backwards during switch-off is very large, so that the drive energy is of the same order of magnitude in both time intervals, that is to say the interval in which said transistor conducts and the interval in which it is switched off. If a Darlington pair is used, the drive energy therefor is much lower in said first interval, due to the current gain of the additional transistor, than the control energy in the second interval. From this it will be apparent that the drive by means of a driver transformer is not possible without further measures.

A further difficulty is the result of the fact that the drive of the high-voltage power transistor must not satisfy the same conditions during both intervals. During the interval in which the transistor conducts, the forward flowing base current must have a given variation so that the dissipation during switch-off, which is related to the number of accumulated charge carriers during said interval, remains low. In contradistinction therewith the base current flowing backwards during switch off must have a variation which is described in greater detail in Dutch Patent Specification No. 138,210 (PHN 2526). Due to the presence of the additional transistor, the design of the drive circuit of the high-voltage power transistor, disclosed in this Patent Specification, cannot be used without further measures.

SUMMARY OF THE INVENTION

It is an object of the invention to provide a circuit arrangement comprising a Darlington pair in which these conflicting requirements can be satisfied while the use of a driver transformer is possible. The circuit arrangement according to the invention is to this end characterized in that the drive means also comprise two current paths, namely a first current path comprising a switched-mode current source coupled to the base electrode of the additional transistor for making and maintaining the high-voltage power transistor conductive, and a second current path comprising an inductance, a substantially constant voltage source and a switch and which is included between the emitter and the base electrode of the high-voltage power transistor for blocking this transistor, the switched current flowing during operation while the switch is cut off, and not flowing while the switch is conducting.

As, in accordance with the invention the forward base current and the reverse base current flow through different current paths such that they can be optimized separately, while a driver transformer need not be included in the second current path as it would situated between the base and the emitter electrode of one and the same transistor.

In accordance with a further recognition of the invention the circuit arrangement is characterized in that the substantially constant-voltage source is passed in operation by the emitter current of the high-voltage power transistor for generating the substantially constant voltage.

In another embodiment the circuit arrangement according to the invention, comprising a diode arranged in parallel with the base-emitter path of the additional transistor and with a conduction direction opposite thereto, is characterized by a first transistor connected to the primary winding of a driver transformer, a secondary winding of which is connected via a separating diode to the base of the additional transistor, and by a second transistor, the base of which is supplied with a switching drive signal originating from the driver transformer, this second transistor being in series with the inductance, the series arrangement thus formed being connected to the base of the additional transistor and the first transistor being adjusted as a switched-mode current source.

DESCRIPTION OF THE DRAWINGS

The invention will be further explained by way of non-limitative example with reference to the Figures in which.

DESCRIPTION OF THE PREFERRED EMBODIMENT

Figure 1:
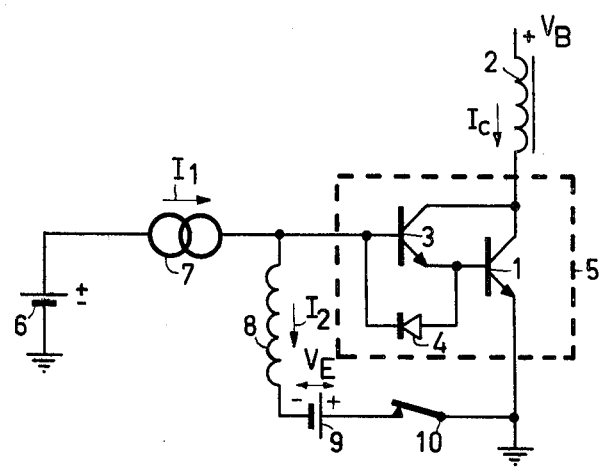
FIG. 1 is a circuit diagram of the circuit arrangement according to the invention.

In FIG. 1 reference numeral 1 denotes a high-voltage power transistor of the npn type, the collector of which is connected via a winding 2 to the positive terminal of a supply voltage source supplying a d.c. voltage $+V_B$ the negative terminal thereof being connected to ground. Winding 2 may be the primary winding of a transformer, not shown in the drawing, which constitutes part of a d.c. voltage converter of a known type which generates one or more d.c. voltages which are stabilized against variations in voltage $V_B$ and/or of a load. This stabilisation is obtained in a known manner, for example by means of a phase shift, depending on a secondary voltage of the transformer, of one of the edges of a switching signal applied to the base of transistor 1. Also, winding 2 may be the primary winding of a line output transformer in a television receiver or of a transformer in a combined supply voltage and line deflection circuit.

The emitter of a transistor 3 of the npn type is connected to the base of transistor 1 and the collector of transistor 3 to the collector of transistor 1. A diode 4 is arranged in parallel with the base-emitter path of transistor 3 and with the conduction direction opposite thereto. While elements 1, 3 and 4 may be structured as discrete elements, they may, alternatively, be integrated in known manner in one and the same semiconductor body. If this is the case they constitute one element 5 having three electrodes, the collector of element 5 being the collector of transistor 1, while the base of element 5 is the base of transistor 3 and the emitter of element 5 the emitter of transistor 1, element 5 behaving externally as one single transistor. Not considering diode 4, element 5 is a so-called Darlington pair.

The base of transistor 3 is connected via a current source 7 to a positive d.c. voltage source 6, while an inductance 8, a d.c. voltage source 9 and a switch 10 are included in series between the base of transistor 3 and the emitter of transistor 1. One point of this series arrangement, for example the emitter of transistor 1, and also the negative terminal of source 6, is connected to ground. The current generated by source 7 is switched in such a manner that it periodically assumes the values $I_1$ and zero. In a similar manner switch 10 is made periodically conducting and non-conducting. They both have the same frequency, for example the frequency of the line deflection if the circuit of FIG. 1 constitutes part of a television receiver (not shown) and that on the understanding that current $I_1$ flows while switch 10 is non-conducting and that current $I_1$ does not flow while switch 10 does conduct.

Figure 2:
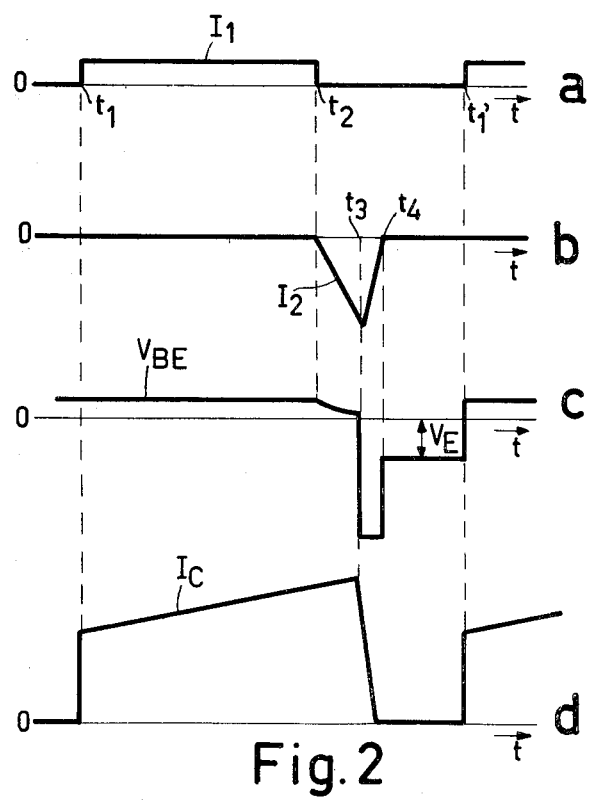
FIG. 2 shows waveforms occurring therein.

At an instant $t_1$ the current $I_1$ generated by current source 7 starts flowing to the base of transistor 3 so that this transistor and, consequently, also transistor 1 becomes conductive. The variation of current $I_1$ versus time is plotted in FIG. 2a, while FIG. 2c and 2d, respectively, show the variation of the voltage $V_{BE}$ between the base of transistor 3 and the emitter of transistor 1 and the variation of the collector current $I_c$ of transistor 1. The variation of current $I_1$ depends on the switch-on and switch-off conditions of transistors 1 and 3. Current $I_1$ may, for example, be constant. The value thereof is sufficient to drive transistor 1 into saturation after amplification by transistor 3. Voltage $V_{BE}$ is positive. Source 7 is a current source, that is to say that the base current $I_1$ generated by it is substantially independent of voltage $V_{BE}$. Voltage $V_B$ is present across winding 2 so that current $I_c$ increases linearly.

At an instant $t_2$ the current generated by source 7 stops flowing while switch 10 is made conductive. Voltage source 9, whose negative terminal is connected to inductance 8, ensures switching off of transistor 1. The charge carriers present in excess in the base and in the collector layer of transistor 1 cause, in conjunction with voltage source 9, a negative current $I_2$ to flow through diode 4 and inductance 8, which is plotted in FIG. 2b versus time. The variation after instant $t_2$ of current $I_2$, voltage $V_{BE}$ and current $I_c$ is further explained in Dutch Patent Specification No. 138,210 (PHN 2526) referred to above. Consequently it will be sufficient to state the following. Due to the presence of inductance 8, the variation of current $I_2$ is delayed while transistor 1 is still in the saturation state. At an instant $t_3$ current $I_2$ attains a maximum value whereafter it decreases. At approximately the same instant, voltage $V_{BE}$ assumes, at a sufficient energy in the inductance, 8 the value of the breakdown voltage of the base-emitter path of transistor 1, while current $I_c$ decreases very rapidly and becomes zero. At the instant $t_4$ at which current $I_2$ becomes zero, voltage $V_{BE}$ assumes the value $V_E$ of voltage source 9. This situation is maintained until the instant $t'_1$ at which current $I_1$ flows again while switch 10 is brought to the cut-off condition, at which a new period starts.

Diode 4 offers a path for the reverse base current $I_2$, as this current would not be able to flow through the reversed-poled base-emitter path of transistor 3. If, however, the requirement that the Darlington pair 1, 3 constitutes an element 5 having three terminals only is relinquished, diode 4 can be omitted and that on the condition that inductance 8 is not connected to the base of transistor 3 but to that of transistor 1.

It was assumed in the preceding that the switch-on time of the Darlington pair is negligibly short, which is true in many cases. The switch-off time, on the contrary, is comparatively long and highly depends on the quantity of charge carriers in the layers of transistor 1 as well as on the non-constant current gain factor of transistor 3 and, consequently, of the offered forward current $I_1$. If current $I_1$ is too large, the switch-off time will become longer; if it is too small, the transistor will be saturated less, that is to say the so-called knee voltage will be too high. Both cases cause an increase in dissipation. It is, consequently, clear that a proper variation must be chosen for current $I_1$, in which any variations, for example for control purposes of the interval $t_1$ to $t_2$ and of spreads in the quantity of the charge carriers due to tolerances in the value of voltage $V_{BE}$, must be taken into account. From the preceding it appears that current $I_1$ must indeed be generated by a current source because variations in this current are little dependent on properties of the circuit in which it flows.

Source 9, which attends to the drive during the switch-off time between instants $t_2$ and $t_4$, must, on the contrary, be a voltage source. Since the variation of current $I_2$ is determined by the value of voltage $V_E$ and by the value of inductance 8, it is necessary that source 9 have a low internal resistance. The variation of current $I_2$ can be kept under control by the choice of said value in such a manner that the charge carriers get the opportunity to move to the base layer from which they are subsequently removed without this process being dictated by an external current source. From the preceding it appears that the variation in the forward base current $I_1$ of transistor 1 and that of the reverse base current $I_2$ thereof can be optimized separately.

Figure 3:
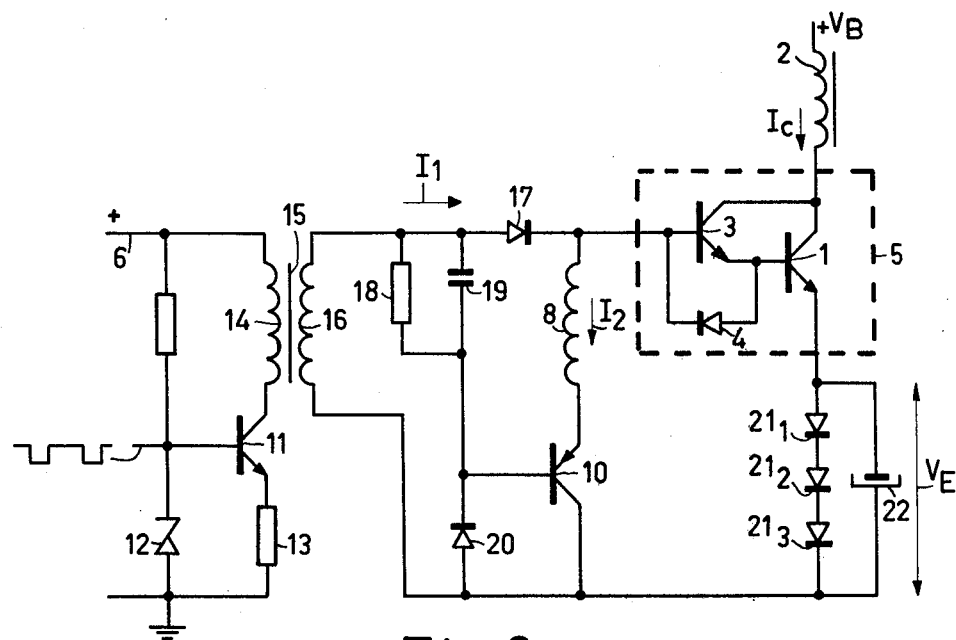
FIG. 3 shows an embodiment of the circuit arrangement of FIG. 1.

FIG. 3 shows another embodiment of the circuit arrangement of FIG. 1. In FIG. 3 the same reference numerals refer to the same components as in FIG. 1. A driver transistor 11 performs the function of current source 7. For this purpose the base thereof is connected to a constant voltage by means of a zener diode 12 while a resistor 13 is included in the emitter lead. A switching signal is superimposed on the voltage at the base of transistor 11 in such a way that transistor 11 does not become saturated during the conduction intervals. The collector of transistor 11 is connected to the primary winding 14 of a driver transformer 15, a secondary winding 16 of which is connected to the base of transistor 3 via a diode 17. The conduction sense of diode 17 is that of current $I_1$ in FIG. 1. The winding sense of windings 14 and 16 can, for example, be such that transistor 11 conducts while transistor 3 is cut-off and vice-versa. The series arrangement of an RC parallel network 18, 19 with a diode 20 is in parallel with winding 16, the cathode of diode 20 being connected to network 18, 19 and to the base of a transistor 10 of the pnp-type which functions as switch 10 in FIG. 1. The emitter of transistor 10 is connected to the inductance 8 and the cathode thereof to the anode of diode 20.

Voltage source 9 is implemented by means of a series of diodes, for example three, $21_1$, $21_2$ and $21_3$, included between the emitter of transistor 1 and the collector of transistor 10 and a smoothing capacitor 22 which is in parallel with the series arrangement of the diodes 21, the diodes 21 having the same conduction direction as that of the emitter current of transistor 1. The junction of winding 16, diode 20, the collector of transistor 10, and diode $21_3$ and capacitor 22 is connected to the negative terminal of source $+V_B$.

During the conduction intervals of transistor 1, the emitter current thereof causes a substantially constant voltage drop across diodes $21_1$, $21_2$ and $21_3$. A still more constant voltage drop can be obtained by using a zener diode instead of the above diodes 21. If capacitor 22 has a sufficiently high capacitance the voltage across it is substantially constant. This is the above-defined voltage $V_E$. Because the above-mentioned junction is connected to the negative terminal of the supply source instead of the emitter of transistor 1, it is ensured that voltage $V_E$ remains substantially constant also with short conduction intervals of transistor 1. In the opposite case the source 9 of FIG. 1 would be included in the base circuit of transistor 3 so that with short conduction intervals, insufficient energy would be supplied by the base current to keep voltage $V_E$ constant.

Transistor 11 acts as a current source and the collector current thereof supplies, by means of transformer 15, the forward base current of transistor 3, which current flows through diode 17. Transistor 11 may alternatively be implemented as a switching transistor while a current source, for example a transistor, is included between winding 14 and source 6. If the voltage across winding 16 is subjected to a negative variation at instant $t_2$, transistor 10 becomes conducting, causing current $I_2$ to flow, while diode 17 is cut off. So diode 17 separates the forward current path from the reverse current path.

In the above-mentioned case in which inductance 8 is not connected to the base of transistor 3 but to that of transistor 1, not only diode 4 but also diode 17 can be dispensed with, while the separating function is performed by the base-emitter path of transistor 3. Due to the separation no reverse base current flows in both cases from transistor 1 to winding 16, which would occur rapidly. In a similar manner no current flows through inductance 8 in the interval $t_1$ to $t_2$. Due to such a current, energy would be stored in inductance 8, which inductance would cause an acceleration in the variation of current $I_2$, whereas a delay is required. In view of the small number of charge carriers in the layers of transistor 3 the reverse base current thereof may flow quickly. Capacitor 19 and diode 20 ensure an improved switching of transistor 10. At instant $t'_1$ the voltage across winding 16 becomes positive, so that diode 17 conducts while transistor 10 is cut off.

The circuit of FIG. 3 has the advantage that a d.c. isolation between the power stage and the remaining part of the device of which this stage constitutes a part, can be realised in a simple manner thanks to the presence of transformer 15. Both terminals of voltage $+V_B$ can, for example, be d.c. connected to the line voltage supply, while the leads, which do not carry voltage, of the remaining parts of the device, for example the leads of elements 12 and 13 not connected to transistor 11, are connected to ground thereof. This means isolation is not required for the current path of current $I_2$. Referring to FIG. 3, it should be noted that a comparatively large leakage inductance which may be produced by a plurality (not shown) of secondary windings of transformer 15 is still permissible because only current $I_1$ must be transferred by the transformer, which current is generated by a current source.

Figure 4:
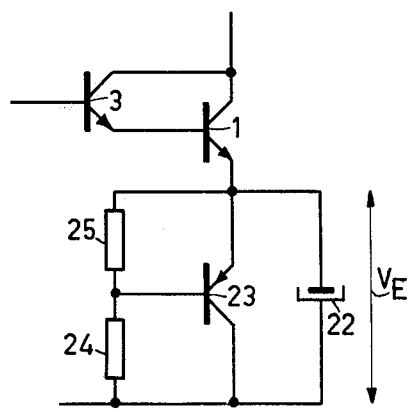
FIG. 4 shows a variant for a detail of FIG. 3.

It will be noted that voltage source 9 can alternatively be realised by including a transistor in the emitter lead of transistor 1, for example if voltage $V_E$ must have a rather high value. FIG. 4 shows such a transistor 23 of the pnp-type. By means of two resistors 24 and 25 the collector-emitter voltage thereof can be brought to the desired value, resistor 24 being included between the collector and the base of transistor 23 and resistor 25 between the base and the emitter thereoy.

With a further variant of the circuit of FIG. 3 voltage $V_E$ is generated by means of a winding coupled to winding 2. A current which is proportional to current $I_c$ flows therethrough. A rectifier and, parallel to the series arrangement thus formed, a resistor, required for the emitter current, and a smoothing capacitor 22 are arranged in series with said winding. The resistor can be dispensed with if the junction of the emitter of transistor 1, capacitor 22 and said rectifier is connected to ground. As, as a rule, voltage $V_B$ is not constant, voltage $V_E$ is not constant either, which can be permissible in certain circumstances. Otherwise $V_E$ can be stabilized in known manner, for example by means of a zener diode. It will be obvious that voltage $V_E$ can also be generated by means of a transformer connected to the line voltage supply.

What is claimed is

1. A circuit arrangement comprising a high-voltage power transistor, drive means for supplying a pulse-shaped switching signal to the base electrode thereof, a voltage supply source and a load impedance connected to the collector electrode of the high-voltage power transistor and to the voltage supply source, the collector current of the high-voltage power transistor, driven to the saturation state, supplied by the voltage supply source, being interruptable under the influence of the pulse-shaped switching signal applied thereto, and the drive means comprising an additional transistor, the emitter electrode of which is connected to the base electrode of the high-voltage power transistor and the collector electrode of the additional transistor is connected to the collector electrode of the high-voltage power transistor, wherein the drive means further comprises two current paths, namely a first current path comprising a switched-mode current source coupled to the base electrode of the additional transistor for making and maintaining the high-voltage power transistor conductive, and a second current path which comprises an inductance, a substantially constant-voltage source and a switch and which is included between the emitter and the base electrode of the high-voltage power transistor for blocking this transistor, the switched current flowing during operation while the switch is cut off and not flowing while the switch is conducting.

2. A circuit arrangement as claimed in claim 1, wherein the substantially constant-voltage source comprises at least a diode and a capacitor arranged in parallel therewith.

3. A circuit arrangement as claimed in claim 2, wherein the diode is a zener diode.

4. A circuit arrangement as claimed in claim 1, wherein the substantially constant-voltage source comprises a transistor whose collector-emitter path is included in the emitter lead of the high-voltage power transistor, a capacitor being in parallel with this collector-emitter path.

5. A circuit arrangement as claimed in claim 1, which further comprises a driver transformer for coupling the switched-mode current source to the first current path.

6. A circuit arrangement as claimed in claim 1, which further comprises a diode for separating the two current paths from one another.

7. A circuit arrangement as claimed in claim 1, wherein the switch is operated by the switched current.

8. A circuit arrangement as claimed in any of the preceding claims 1–7, comprising a diode arranged in parallel with the base-emitter path of the additional transistor and with a conduction direction opposite thereto, a driver transformer having a primary and a secondary winding, a first transistor connected to the primary winding of the driver transformer, a separating diode coupling the secondary winding to the base of the additional transistor, and a second transistor the base of which is supplied with a switching drive signal originating from the driver transformer, this second transistor being in series with the inductance, the series arrangement thus formed being connected to the base of the additional transistor and the first transistor being adjusted to function as a switched-mode current source.

9. A circuit arrangement as claimed in any of the claims 1 or 4–7 inclusive, which further comprises a driver transformer having a primary and a secondary winding, a first transistor connected to the primary winding of the driver transformer, the secondary winding being connected to the base of the additional transistor, and a second transistor, the base of which is supplied with a switching drive signal originating from the driver transformer, the second transistor being arranged in series with the inductance, the series arrangement thus formed being connected to the base of the high-voltage power transistor and the first transistor being adjusted to function as a switched-mode power current source.

* * * * *